(12) United States Patent
Hori

(10) Patent No.: US 8,981,851 B2
(45) Date of Patent: Mar. 17, 2015

(54) POWER SUPPLY MODULATOR AND METHOD FOR CONTROLLING SAME

(75) Inventor: Shinichi Hori, Tokyo (JP)

(73) Assignee: NEC Corporation, Tokyo (JP)

( * ) Notice: Subject to any disclaimer, the term of this patent is extended or adjusted under 35 U.S.C. 154(b) by 39 days.

(21) Appl. No.: 13/813,692

(22) PCT Filed: Apr. 26, 2011

(86) PCT No.: PCT/JP2011/002447
§ 371 (c)(1),
(2), (4) Date: Feb. 1, 2013

(87) PCT Pub. No.: WO2012/017579
PCT Pub. Date: Feb. 9, 2012

(65) Prior Publication Data
US 2013/0127556 A1    May 23, 2013

(30) Foreign Application Priority Data
Aug. 3, 2010   (JP) ................. 2010-174454

(51) Int. Cl.
*H03F 3/04*   (2006.01)
*H03K 3/01*   (2006.01)
(Continued)

(52) U.S. Cl.
CPC ............. *H03K 3/01* (2013.01); *H03F 1/0244* (2013.01); *H03F 3/189* (2013.01); *H03F 3/24* (2013.01); *H03F 2200/451* (2013.01);
(Continued)

(58) Field of Classification Search
CPC .......... H03F 2200/451; H03F 2200/102; H03F 1/0222; H03F 3/195; H03F 2200/504; H03F 3/24; H03F 2200/462; H03F 1/0211; H03F 1/0244

USPC ......................... 330/136, 251, 297
See application file for complete search history.

(56) References Cited

U.S. PATENT DOCUMENTS

| 4,580,111 A | 4/1986 | Swanson |
| 5,986,910 A | 11/1999 | Nakatsuka |

(Continued)

FOREIGN PATENT DOCUMENTS

| JP | 11154833 A | 6/1999 |
| JP | 2003500873 A | 1/2003 |

(Continued)

OTHER PUBLICATIONS

WO 2010/ 073941 Power Amplification Device, Kunihiro et al, WIPO PUB. July 1, 2010.*

(Continued)

*Primary Examiner* — Arnold Kinkead
(74) *Attorney, Agent, or Firm* — Sughrue Mion, PLLC

(57) ABSTRACT

A power amplifier amplifies a radio signal. Negative feedback is applied to a linear amplifier and the linear amplifier receives an envelope signal. A pulse current modulator is connected to a power supply terminal of a power amplifier and an output terminal of the linear amplifier via an inductor, and outputs a pulse current according to a control signal generated from the envelope signal. A diode has an anode connected to an output terminal of a direct current source and a cathode connected to an output terminal of the pulse current modulator. A switching element is disposed between the output terminal of the direct current source and a ground potential, and is controlled by the control signal.

11 Claims, 8 Drawing Sheets

(51) Int. Cl.
*H03F 1/02* (2006.01)
*H03F 3/189* (2006.01)
*H03F 3/24* (2006.01)
*H02M 3/158* (2006.01)
*H02M 1/00* (2006.01)

(52) U.S. Cl.
CPC ....... *H03F 2200/462* (2013.01); *H03F 1/0227* (2013.01); *H02M 3/1584* (2013.01); *H02M 2001/0045* (2013.01); *H03K 2217/0063* (2013.01); *H03K 2217/0072* (2013.01)
USPC ............................ 330/297; 330/136; 330/251

(56) References Cited

U.S. PATENT DOCUMENTS

| | | | |
|---|---|---|---|
| 6,348,781 B1 * | 2/2002 | Midya et al. | 323/224 |
| 6,566,944 B1 | 5/2003 | Pehlke et al. | |
| 6,590,940 B1 | 7/2003 | Camp, Jr. et al. | |
| 7,103,114 B1 | 9/2006 | Lapierre | |
| 7,394,233 B1 | 7/2008 | Trayling et al. | |
| 8,451,054 B2 * | 5/2013 | Kunihiro et al. | 330/136 |
| 2004/0124913 A1 | 7/2004 | Midya et al. | |
| 2008/0290938 A1 | 11/2008 | Gupta et al. | |
| 2009/0184764 A1 | 7/2009 | Markowski et al. | |

FOREIGN PATENT DOCUMENTS

| | | |
|---|---|---|
| JP | 2003510874 A | 3/2003 |
| JP | 2005518745 A | 6/2005 |

OTHER PUBLICATIONS

The international search report for PCT/JP2011/002447 mailed on Jul. 12, 2011.
Jinseong Jeong et al., "High-Efficiency WCDMA Envelope Tracking Base-Station Amplifier Implemented With GaAs HVHBTs", IEEE J. Solid-State Circuits, Oct. 2009, vol. 44, No. 10, pp. 2629-2639.
The Extended European Search Report for EP Application No. 11814219.9 dated on Dec. 4, 2013.

* cited by examiner

POWER SUPPLY MODULATOR AND METHOD FOR CONTROLLING SAME

This application is a National Stage Entry of PCT/JP2011/002447 filed Apr. 26, 2011, which claims priority from Japanese Patent Application 2010-174454 filed Aug. 3, 2010, the contents of all of which are incorporated herein by reference, in their entirety.

TECHNICAL FIELD

The present invention relates to a power supply modulator used for a communication device, such as a cellular phone or a wireless LAN, and a method for controlling the same, and more particularly, to a power supply modulator having an excellent power efficiency, and a method for controlling the same.

BACKGROUND ART

A transmission unit of a communication device, such as a cellular phone or a wireless LAN, is required to operate with low power consumption. Such a transmission unit of a communication device is required to operate with low power consumption regardless of the magnitude of output power, and is also required to ensure a high accuracy of transmission signals. In particular, a power amplifier disposed at a final stage of a transmission unit of a communication device occupies 50% or more of the power consumption of the entire transmitter. For this reason, the power amplifier disposed at the final stage of the transmission unit of the communication device needs to have a high power efficiency.

The power amplifier typically includes one transistor. A radio signal input to a gate is converted into current information by the transistor. The converted information is output to a load from a drain terminal through a matching circuit. The drain terminal is connected to a power supply in parallel with the matching circuit through an inductor. The efficiency $\eta d$ of the power amplifier is in proportion to envelope components of the radio signal. The efficiency $\eta d$ of the power amplifier becomes the maximum efficiency $\eta dmax$ when an envelope voltage in the drain terminal is equal to a power supply voltage. When the envelope voltage becomes larger than this, this produces significant signal distortion, thereby causing a failure of communication. Accordingly, the envelope voltage is typically adjusted so that the peak value of the envelope voltage of the radio signal becomes equal to the power supply voltage. This means that an amplitude value of the signal changes in time, and as the rate (backoff) of the average amplitude value to the instantaneous maximum amplitude value increases, the average efficiency decreases by the amount corresponding to this rate. For example, with a signal having a backoff of about 7 dB (2.24 times in the amplitude ratio), the efficiency $\eta d$ of the power amplifier is about $1/2.24$ of $\eta dmax$.

In recent years, an envelope tracking system has been attracting attention as a system to improve the average power efficiency of a power amplifier. In this system, a power supply terminal of the power amplifier is connected to a power supply modulator having a variable voltage value through an inductor. A voltage output from the power supply modulator is controlled to follow envelope components of the radio signal output from the power amplifier. In this system, a voltage applied to the envelope voltage and a voltage applied to the power supply terminal of the power amplifier through the inductor are always equal to each other. Thus, the power amplifier always operates with the maximum efficiency $\eta dmax$.

When the power efficiency of the power supply modulator is represented by $\eta v$ and the power efficiency of the power amplifier is represented by $\eta d$, the power efficiency $\eta a$ of the whole system in the envelope tracking system can be expressed by the product of $\eta v$ and $\eta d$, as shown in the following expression (1).

$$\eta a = \eta d \cdot \eta v \quad (1)$$

The power efficiency $\eta d$ of the power amplifier is fixed to $\eta dmax$ when the output voltage of the power supply modulator ideally matches an envelope signal. Accordingly, the power efficiency of the whole system is in proportion to the power efficiency $\eta v$ of the power supply modulator.

FIG. 8 is a block diagram showing a configuration of a power supply modulator 200 according to a typical envelope tracking system (Non-patent literature 1). The power supply modulator 200 includes a variable voltage source 21, a linear amplifier 22, a current sensor 23, and an inductor 25. In the power supply modulator 200, a radio signal WS is input to a power amplifier 24 connected to the power supply modulator 200, and at the same time, an envelope signal ES of the radio signal WS is input to a control terminal of the linear amplifier 22. The linear amplifier 22 outputs a current so that an output voltage becomes equal to a voltage signal input to the control terminal. The current sensor 23 includes an amplifier 231 and a resistor 232. Each end of the resistor 232 is connected to an input terminal of the amplifier 231. The current sensor 23 determines whether an output current of the linear amplifier 22 is a source direction or a sink direction to output a voltage control signal to the variable voltage source 21. The variable voltage source 21 is connected to the power amplifier 24 through inductors 25 and 26.

When the output current of the linear amplifier 22 is the source direction, the voltage value of the variable voltage source 21 is set to a high value. Thus, the value of the current supplied from the variable voltage source 21 to the power amplifier 24 increases. Further, the current output from the linear amplifier 22 in the source direction decreases by the amount corresponding to the increase in the current supplied from the variable voltage source 21. Meanwhile, when the current of the linear amplifier 22 is the sink direction, the voltage value of the variable voltage source 21 is set to a low value. Thus, the current output from the variable voltage source 21 decreases. The current in the sink direction of the linear amplifier 22 decreases by the amount corresponding to the decrease in the current output from the variable voltage source 21. The above operation corresponds to an operation of correcting a difference between a current supplied from the variable voltage source 21 and a current required to reproduce envelope signals ES by the linear amplifier 22.

Assume herein that the efficiency of the variable voltage source 21 is 100%. Further, power consumed by the variable voltage source 21 is represented by Pvvar, power consumed by a power supply of the linear amplifier 22 is represented by Pla, and heat loss generated in the linear amplifier 22 is represented by Plaloss. In this case, the efficiency $\eta v$ of the power supply modulator 200 is expressed by the following expression (2).

$$\eta v = (Pvvar - Plaloss)/(Pvvar + Pla) \quad (2)$$

When it is possible to reproduce envelope signals only by the current of the variable voltage source 21, the linear amplifier 22 does not operate. Since the power consumption Pla and the heat loss Plaloss become zero, the power efficiency $\eta v$ of the power supply modulator 200 is 100%. Accordingly, from the expression (1), the efficiency ηa of the whole system becomes equal to the theoretical maximum efficiency ηdmax of ηd.

CITATION LIST

Non-Patent Literature

Non Patent Literature 1: Jinseong Jeong et al., "High-Efficiency WCDMA Envelope Tracking Base-Station Amplifier Implemented With GaAs HVHBTs", IEEE J. Solid-State Circuits, October 2009, vol. 44, no. 10, pp. 2629-2639.

SUMMARY OF INVENTION

Technical Problem

However, the inventor has found that the following problems are raised in the example stated above. In reality, it is difficult to reproduce the envelope signals ES only with the current of the variable voltage source 21, and the linear amplifier 22 causes some heat loss. In this case, the power efficiency ηv of the power supply modulator 200 is smaller than ηdmax.

FIG. 9 is a block diagram showing a configuration of the typical variable voltage source 21. The variable voltage source 21 includes two N-type FETs 31 and 32 connected in series between a power supply potential and a ground potential. Control signals are input to gates of the two N-type FETs 31 and 32 through dedicated driver ICs. More specifically, a control signal is input to the gate terminal of the N-type FET 31 on the side of a power supply VDD through a high-side gate driver (HSD) 33. A control signal is input to the gate terminal of the ground-side N-type FET 32 through a low-side gate driver (LSD) 34. These control signals bring one of the two N-type FETs into the ON state and the other one of the two N-type FETs into the OFF state. When the N-type FET on the side of the power supply VDD is in the ON state, an output potential of the variable voltage source 21 is the power supply potential. Further, when the N-type FET on the ground side is in the ON state, an output potential of the variable voltage source 21 is the ground potential.

When the variable voltage source 21 needs to supply a current to a power amplifier which provides a power of 100 W, for example, the gate width of each of the N-type FETs 31 and 32 is typically about several mm. The gate input capacity in this case is several hundred pF. Accordingly, in order to drive the two N-type FETs 31 and 32, dedicated driver ICs (the HSD 33 and the LSD 34) that are capable of instantaneously supplying a large driving current are used. The bandwidth of the signals that can be reproduced by the variable voltage source 21 is about a Nyquist frequency (half the switching speed). Currently, the switching speed of the HSD using a commercially available silicon-based material is about 1 MHz. Further, the switching speed of the LSD is about 8 MHz, which is several times higher than that of the HSD. The limit of the switching speed of the variable voltage source 21 is determined by the high-side gate driver HSD which is the slowest component. Accordingly, the limit of the switching speed of the variable voltage source 21 is currently about 1 MHz. In summary, the bandwidth of the signals that can be reproduced by the current typical variable voltage source is about 500 kHz.

Meanwhile, in W-CDMA and LTE which are radio standards for cellular phones, the bandwidth of the envelope signals is about 20 MHz. Accordingly, in a typical variable voltage source, it is impossible to reproduce envelope signals. Accordingly, power consumption in the linear amplifier increases and the efficiency of the power supply modulator decreases, resulting in a decrease in efficiency of the whole system.

The present invention has been made in view of the above-mentioned problems, and an object of the present invention is to provide a power supply modulator having favorable noise characteristics and excellent power efficiency, and a method for controlling the same.

Solution to Problem

A power supply modulator according to an exemplary aspect of the present invention includes: a power amplifier for amplifying a radio signal; a linear amplifier to which negative feedback is applied and receiving an envelope signal of the radio signal; and a pulse current modulator connected to a power supply terminal of the power amplifier and an output terminal of the linear amplifier via an inductor, and outputting a pulse current according to a control signal generated from the envelope signal of the radio signal, in which the pulse current modulator includes: a direct current source; a diode having an anode connected to an output terminal of the direct current source and a cathode connected to an output terminal of the pulse current modulator; and a switching element disposed between the output terminal of the direct current source and a ground potential, and controlled by the control signal.

A method for controlling a power supply modulator according to another exemplary aspect of the present invention includes: supplying an envelope signal of a radio signal to a linear amplifier to which negative feedback is applied; and outputting a current from a pulse current modulator to a power supply terminal of a power amplifier for amplifying the radio signal and an output terminal of the linear amplifier, in which the pulse current modulator outputs a current from a direct current source through a diode having an anode connected to an output terminal of the direct current source and a cathode connected to an output terminal of the pulse current modulator, and a switching element disposed between the output terminal of the direct current source and a ground potential is controlled by a control signal generated from the envelope signal of the radio signal.

Advantageous Effects of Invention

According to the present invention, it is possible to provide a power supply modulator having favorable noise characteristics and excellent power efficiency, and a method for controlling the same.

DESCRIPTION OF EMBODIMENTS

Figure 1:
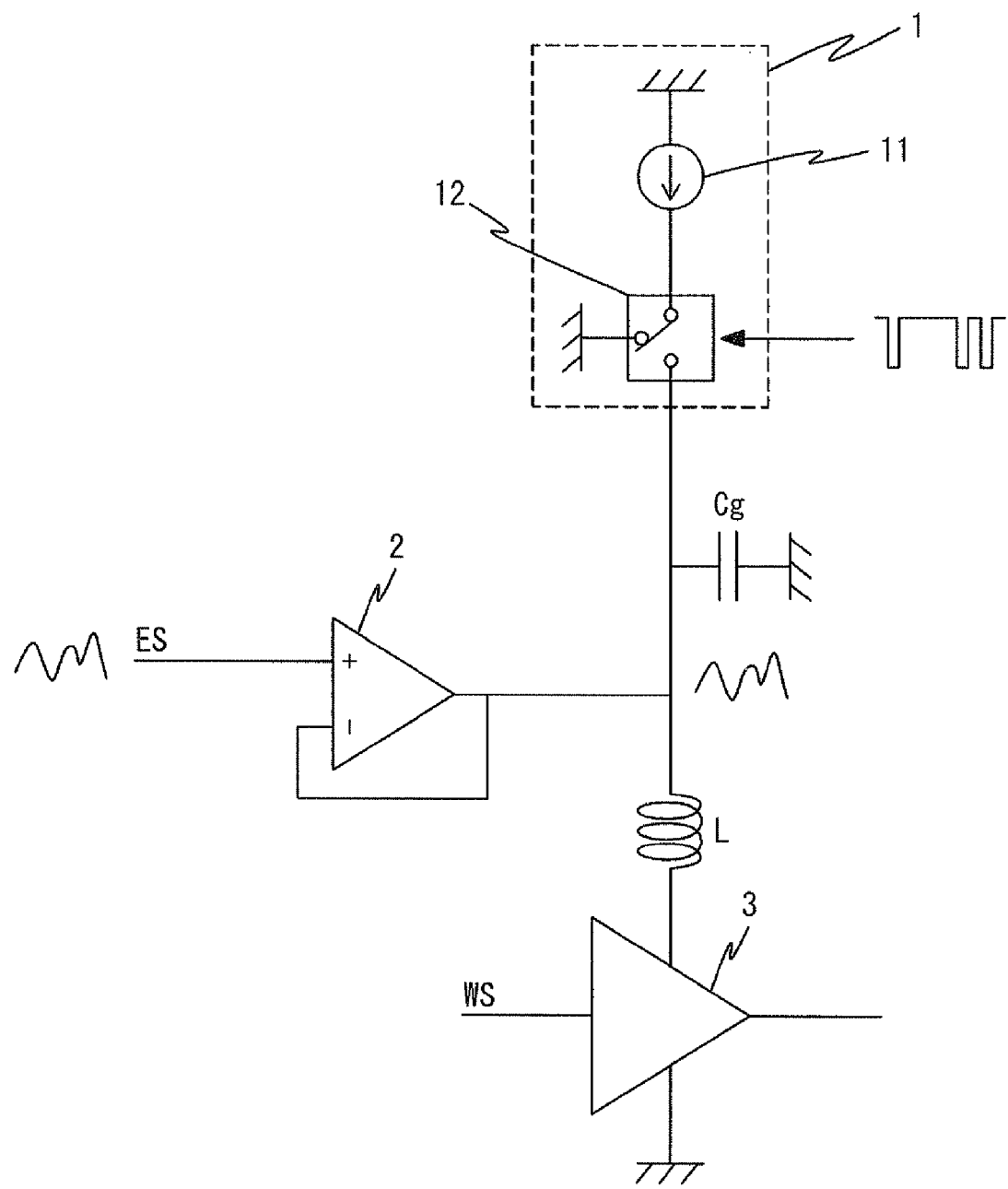
FIG. 1 is a block diagram showing a configuration of a power supply modulator 100 according to a first exemplary embodiment.

Exemplary embodiments of the present invention will be described below with reference to the drawings. In the drawings, the same elements are denoted by the same reference numerals, and repeated explanation is omitted as needed.

First Exemplary Embodiment

First, a power supply modulator according to a first exemplary embodiment of the present invention will be described. FIG. 1 is a block diagram showing a configuration of a power supply modulator 100 according to the first exemplary embodiment. The power supply modulator 100 includes a pulse current modulator 1, a linear amplifier 2, and a power amplifier 3. An output terminal of the pulse current modulator 1 is connected to an output terminal of the linear amplifier 2. The output terminal of the pulse current modulator 1 is further connected to a power supply terminal of the power amplifier 3 through an inductor L.

The linear amplifier 2 is a differential input type operational amplifier having a negative terminal to which an output signal is fed back. When the gain of the linear amplifier 2 is represented by Av, the relation as shown in the following expression (3) is established between a differential input signal Vin and an output signal Vout of the linear amplifier 2.

$$V_{out} = Av \cdot V_{in} \quad (3)$$

The linear amplifier 2 is an operational amplifier in which negative feedback is employed. Accordingly, with the use of the gain Av, the relation shown in the following expression (4) is established between an output voltage Vout_la and an input signal Vin_la of the linear amplifier.

$$V_{out\_la} = Av/(1+Av) \cdot V_{in\_la} \quad (4)$$

By setting the gain Av to a value sufficiently larger than 1, the expression (4) can be approximately simplified as shown in the following expression (5).

$$V_{out\_la} = V_{in\_la} \quad (5)$$

In summary, the linear amplifier 2 outputs the original input voltage signal as an output voltage signal.

The pulse current modulator 1 includes a DC current source 11 and a current switch 12. The current switch 12 selects one of a ground terminal and an output terminal of the current switch 12 as an output destination of an input current according to a control signal. When the control signal is High, the pulse current modulator 1 selects the ground terminal. When the control signal is Low, the pulse current modulator 1 selects the output terminal. The time average value of a current value output from the pulse current modulator 1 is equal to the product of a current value of the DC current source 11 and the rate of time during which the current switch 12 selects the output terminal as the output destination of the input current.

In the power supply modulator 100, a radio signal WS is input to the power amplifier 3. An envelope signal ES of the radio signal is input to the linear amplifier 2. Further, the pulse current modulator 1 receives a 1-bit envelope signal obtained by converting the envelope signal ES into a 1-bit signal. The 1-bit envelope signal may be generated by comparing the magnitude of the envelope signal ES and an arbitrary reference voltage. More specifically, the average value of the envelope signal ES is selected as the reference voltage. Further, the 1-bit envelope signal may also be obtained by limiting the bandwidth of the envelope signal through a filter circuit in advance and then converting the envelope signal into the 1-bit signal.

The 1-bit envelope signal is used as an ON/OFF control signal of the current switch 12. When the 1-bit envelope signal is low, a DC value of the DC current source 11 is output from the pulse current modulator 1. When the 1-bit envelope signal is high, no current is output from the pulse current modulator 1. In summary, the original pulse waveform of the 1-bit envelope signal is output from the pulse current modulator 1 as a pulse current.

A ground capacitor Cg may be connected to the output terminal of the pulse current modulator 1 to suppress harmonic components output from the pulse current modulator 1. With the use of the ground capacitor Cg, harmonic components of the pulse current output from the pulse current modulator 1 are suppressed, and the pulse current output from the pulse current modulator 1 is reproduced as a current having an analog waveform in the output terminal of the linear amplifier 2. The linear amplifier 2 outputs a difference current between the current output from the pulse current modulator 1 and the current required to reproduce the envelope signal ES so that the envelope signal which is the input signal is reproduced as an output signal.

Figure 9:
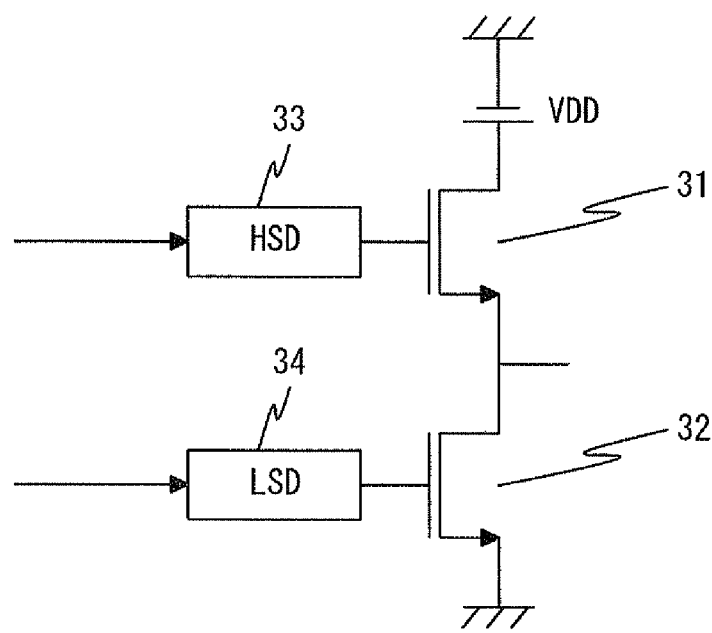
FIG. 9 is a block diagram showing a configuration of a typical variable voltage source 21.

The bandwidth of the signal that can be reproduced by the pulse current modulator 1 is about half the switching speed of the current switch 12 of the pulse current modulator 1. The current switch 12 corresponds to the ground-side N-type FET 32 shown in FIG. 9. Considering the current device performance, the switching frequency of the current switch 12 is about 8 MHz. Accordingly, the bandwidth of the signal that can be reproduced by the pulse current modulator 1 is about 4 MHz. This is about eight times larger than the typical value (about 500 kHz).

Figure 8:
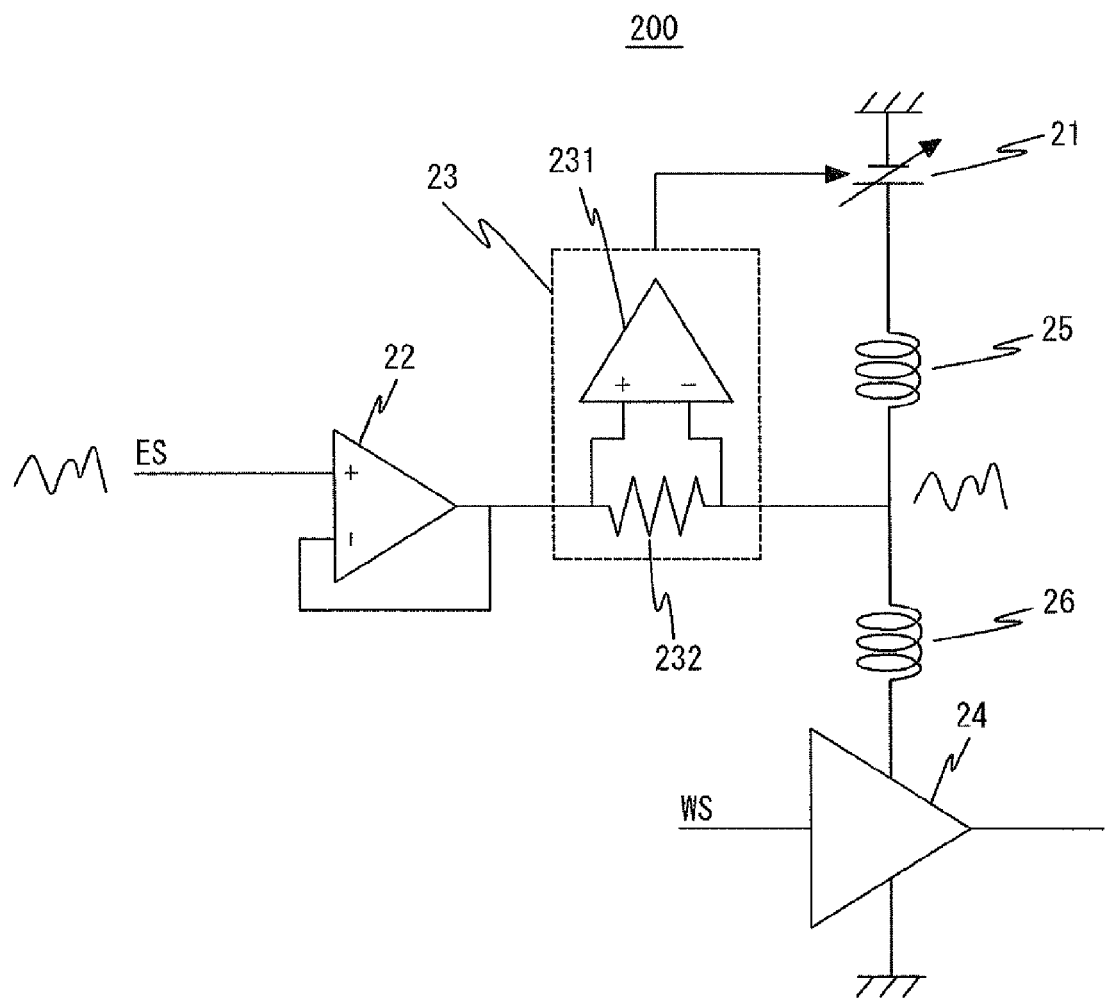
FIG. 8 is a block diagram showing a configuration of a power supply modulator 200 according to a typical envelope tracking system.

In radio signals such as W-CDMA, the bandwidth of the envelope signals is about 20 MHz. When the envelope signal of W-CDMA is input to the typical power supply amplifier 200 as shown in FIG. 8, a variable voltage source in the power supply modulator reproduces components from DC to 500 kHz. Accordingly, the bandwidth that the linear amplifier should correct is from 500 kHz to 20 MHz. On the other hand, when the envelope signal is input to the power supply modulator 100 according to this exemplary embodiment, the pulse current modulator 1 reproduces components from DC to 4 MHz. Accordingly, the bandwidth that the linear amplifier 2 should correct is from 4 MHz to 20 MHz.

As described above, the bandwidth of the current output from the linear amplifier 2 of the power supply modulator 100 according to this exemplary embodiment is smaller than that of a typical linear amplifier. In summary, in the power supply modulator 100, the amount of work performed by the linear amplifier 2 is smaller than that of a typical power supply modulator. Thus, it is shown from the expression (1) that the efficiency of the power supply modulator is higher than that of the typical power supply modulator.

Figure 2:
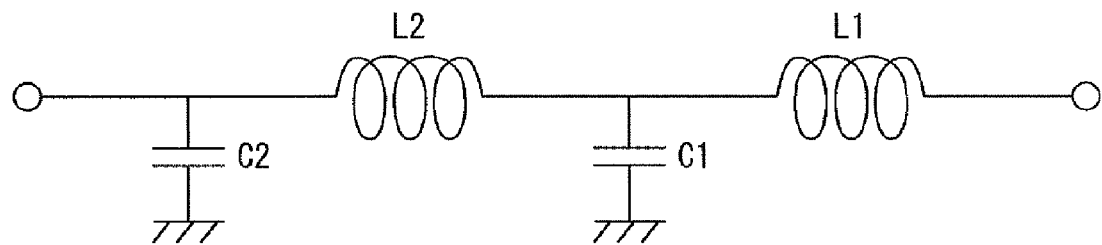
FIG. 2 is a circuit diagram showing a configuration example of a filter circuit 4 according to the first exemplary embodiment.

A filter circuit 4 may be disposed between the pulse current modulator 1 and the output terminal of the linear amplifier 2. This makes it possible to further suppress harmonic components of the current output from the pulse current modulator 1. FIG. 2 is a circuit diagram showing a configuration example of the filter circuit 4. The filter circuit 4 includes inductors L1 and L2 connected in series between two terminals. One end of the inductor L2 is connected to the ground potential through a capacitor C1. The other end of the inductor L2 is connected to the ground potential through a capacitor C2.

Figure 3:
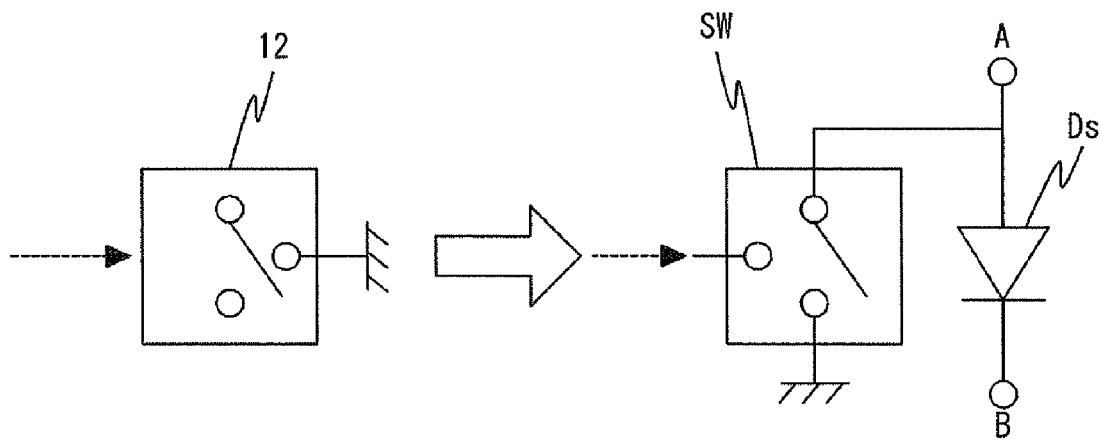
FIG. 3 is a block diagram showing a configuration example of a current switch 12 forming a pulse current modulator 1 according to the first exemplary embodiment.

Subsequently, a specific example of a circuit block of the power supply modulator 100 according to this exemplary embodiment will be described. FIG. 3 is a block diagram showing a configuration example of the current switch 12 forming the pulse current modulator 1. The current switch 12 includes a diode Ds and a switching element SW. The switching element SW is disposed between an anode-side terminal of the diode and a ground potential (or a given DC potential). The anode-side terminal of the diode Ds is further connected to a terminal A. A cathode-side terminal of the diode Ds is connected to a terminal B.

When the switching element SW is in the opened state, a current input to the terminal A is output to the terminal B through the diode Ds. When the switching element SW is in the short-circuit state, the current input to the terminal A is output to the ground potential through the current switching element SW.

Figure 4A:
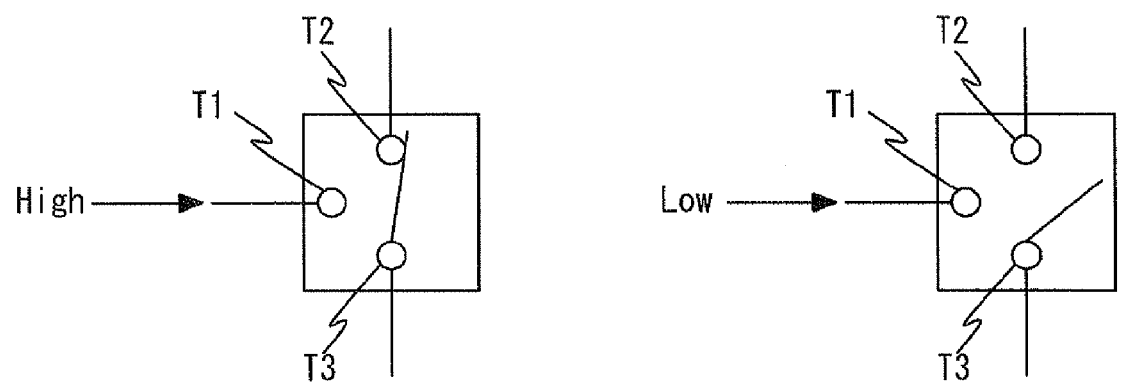
FIG. 4A is a configuration diagram showing an operation of a switching element SW according to the first exemplary embodiment.
Figure 4B:
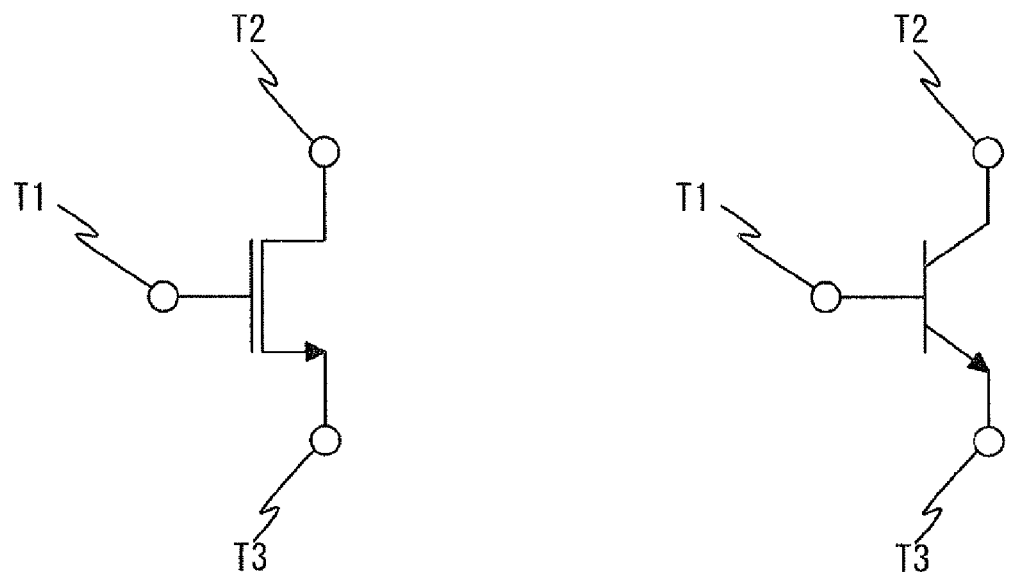
FIG. 4B is a circuit diagram showing a configuration example of the switching element SW according to the first exemplary embodiment.

FIG. 4A is a configuration diagram showing an operation of the switching element SW. The switching element SW has a control terminal T1, a signal terminal T2, and a signal terminal T3. When the high signal is input to the control terminal T1, the signal terminal T2 and the signal terminal T3 are brought into the short-circuit state (ON state). When the low signal is input to the control terminal T1, the signal terminal T2 and the signal terminal T3 are brought into the non-connected state (OFF state). FIG. 4B is a circuit diagram showing a configuration example of the switching element SW. The switching element SW can be implemented using a field-effect transistor (FET) or a bipolar transistor. The control terminal T1 corresponds to a gate terminal of an FET or a base terminal of a bipolar transistor. The signal terminal T2 corresponds to a source terminal of an FET or an emitter terminal of a bipolar transistor. The signal terminal T3 corresponds to a drain terminal of an FET or a collector terminal of a bipolar transistor.

Figure 5:
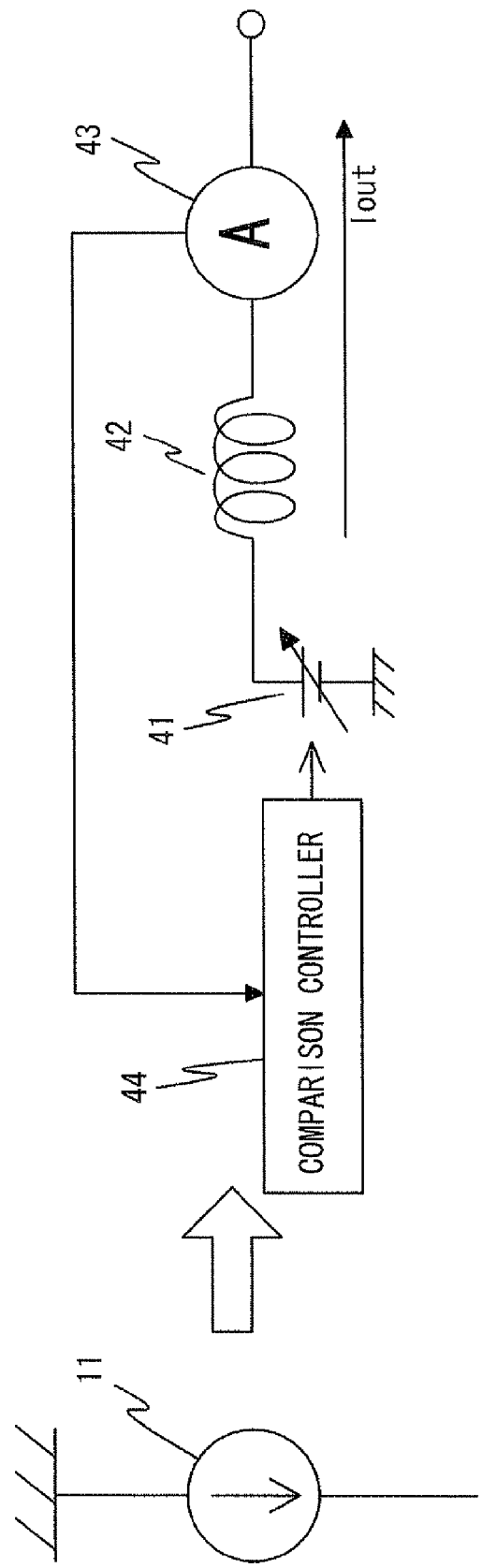
FIG. 5 is a block diagram showing a configuration example of a DC current source 11 according to the first exemplary embodiment.

Subsequently, the DC current source 11 forming the pulse current modulator 1 will be described. FIG. 5 is a block diagram showing a configuration example of the DC current source 11. The DC current source 11 includes a variable DC voltage source 41, an inductor 42, a current sensor 43, and a comparison controller 44. A current output from the variable DC voltage source 41 is output through the inductor 42 and the current sensor 43. The current sensor 43 detects the magnitude of the current flowing through the current sensor 43. The comparison controller 44 controls the voltage of the variable DC voltage source 41 so that the current value detected by the current sensor 43 becomes a desired value.

Assume herein that the voltage value of the variable DC voltage source 41 is represented by Vdc. The inductance of the inductor 42 is represented by Ladd. The value of a load resistor connected to the output terminal of the DC current source Ivn is represented by Rload. The output current of the DC current source Ivn is represented by Tout. Assuming that the voltage value Vdc represents an input signal and Tout represents an output signal, a transfer function F(s) is expressed by the following expression (6).

$$F(s) = Rload/(s \cdot Ladd + Rload) \qquad (6)$$

The above expression shows that the transfer function F(s) is a transfer function of a lowpass filter in which a 3 dB cutoff frequency is given by Rload/(2·π·Ladd). The control signal given to the variable DC voltage source 41 is updated at a speed sufficiently higher than the above-mentioned cutoff frequency, thereby minimizing the variation characteristic of the output current Tout.

Figure 6:
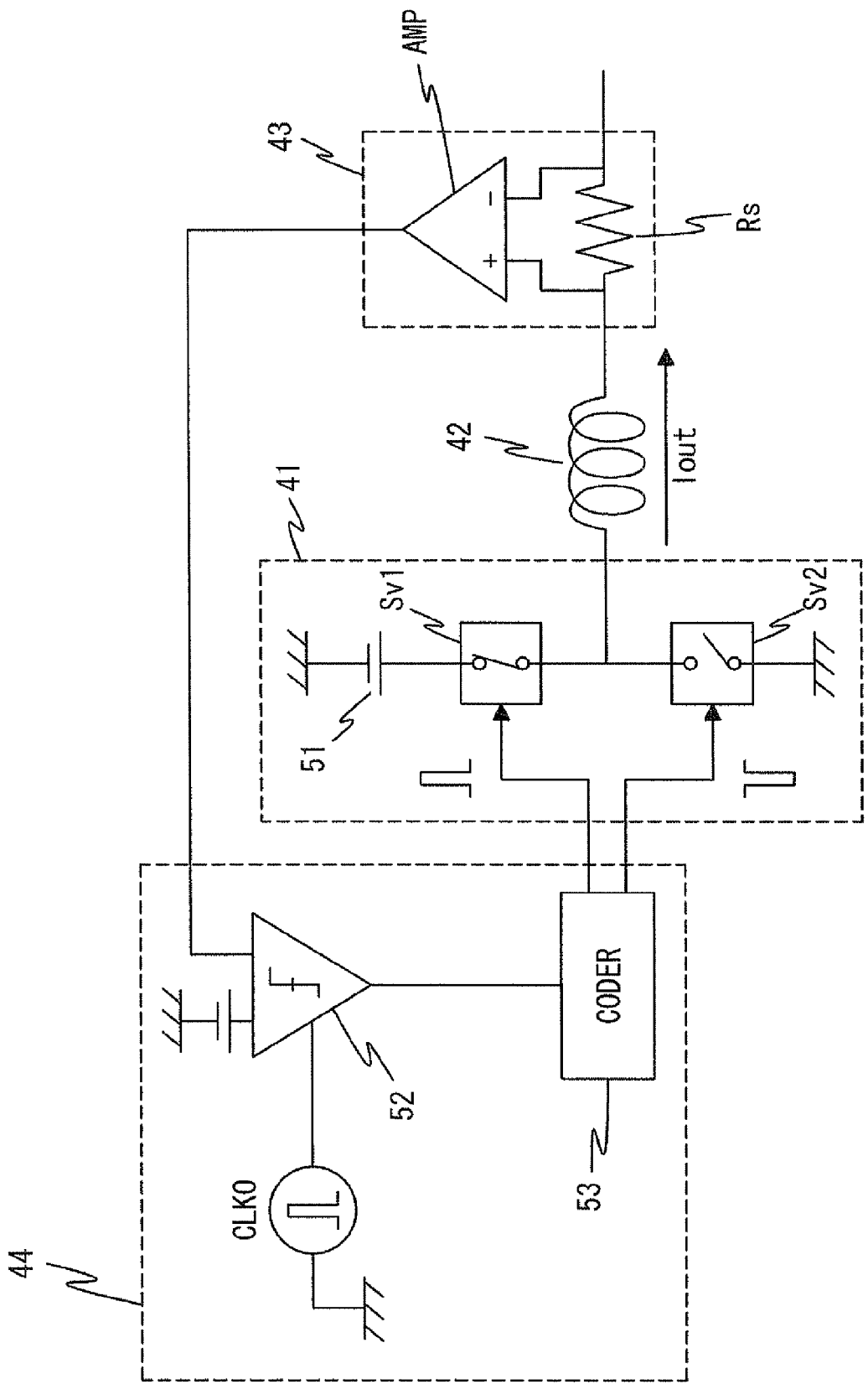
FIG. 6 is a block diagram showing a specific example of a configuration of the DC current source 11 according to the first exemplary embodiment.

The configuration of the DC current source 11 will be described in more detail. FIG. 6 is a block diagram showing a specific example of the configuration of the DC current source 11. The variable DC voltage source 41 has a configuration in which switching elements Sv1 and Sv2 are disposed in series between a DC voltage source 51 and a ground terminal. The switching elements Sv1 and Sv2 may have a configuration shown in FIG. 3, for example. The switching element Sv1 located on the power supply side and the switching element Sv2 located on the ground side perform complementary opening/closing operations. Specifically, when one of the switching elements Sv1 and Sv2 is turned on, the other of the switching elements is turned off. When the switching element Sv1 is turned on, the output voltage of the variable DC voltage source 41 is equal to the power supply voltage. On the other hand, when the switching element Sv2 is turned on, the output voltage of the variable DC voltage source 41 is equal to the ground potential.

The current sensor 43 includes a resistor Rs and a differential input type amplifier AMP. The differential input type amplifier AMP receives voltage information at both terminal nodes of the resistor Rs. When the input current flows through the resistor Rs, a voltage difference which is equal to the product of the current and the resistance value is generated at the both ends of the resistor Rs. The differential input type amplifier AMP amplifies and outputs the voltage difference (in this exemplary embodiment, the amplification factor is a positive value). Note that the voltage difference between the both ends of the resistor Rs and the output value of the differential input type amplifier AMP have a 1:1 relation. That is, the current sensor 43 is capable of converting the current value of the input current into a voltage value and outputting the voltage value.

The comparison controller 44 includes a voltage comparator 52 and a coder 53. The voltage comparator 52 compares the voltage value output from the current sensor 43 with an internal reference value. The case where the output from the current sensor 43 is larger than the internal reference value indicates that the amount of current flowing through the current sensor 43 is larger than a desired value. In this case, the coder 53 outputs a control signal that brings the ground-side switching element Sv2, which forms the variable DC voltage source 41, into the ON state, and brings the power-supply-side switching element Sv1 into the OFF state. This decreases the current output from the variable DC voltage source 41. On the other hand, the case where the output from the current sensor 43 is smaller than the internal reference value indicates that the amount of current flowing through the current sensor 43 is smaller than the desired value. In this case, the coder 53 outputs a control signal that brings the ground-side switching element Sv2, which forms the variable DC voltage source 41, into the OFF state, and brings the power-supply-side switching element Sv1 into the ON state. This increases the current output from the variable DC voltage source 41.

The comparison controller 44 operates in synchronization with an external clock signal from an external clock signal source CLKO. Specifically, the cycle of performing a comparison operation in the voltage comparator 52 and updating the control signal to be supplied to the variable DC voltage source 41 is equal to the cycle of the external clock signal source CLKO. Even when the load connected to the DC current source Ivn is temporally varied, the comparison controller is caused to operate using the clock signal source that generates a clock signal having a sufficiently shorter cycle than the variation cycle. This allows the control signal for the variable DC voltage source 41 to be updated in a period shorter than the variation cycle of the load. The operation described above allows the DC current source Ivn to continuously output a desired DC current almost constantly.

Figure 7:
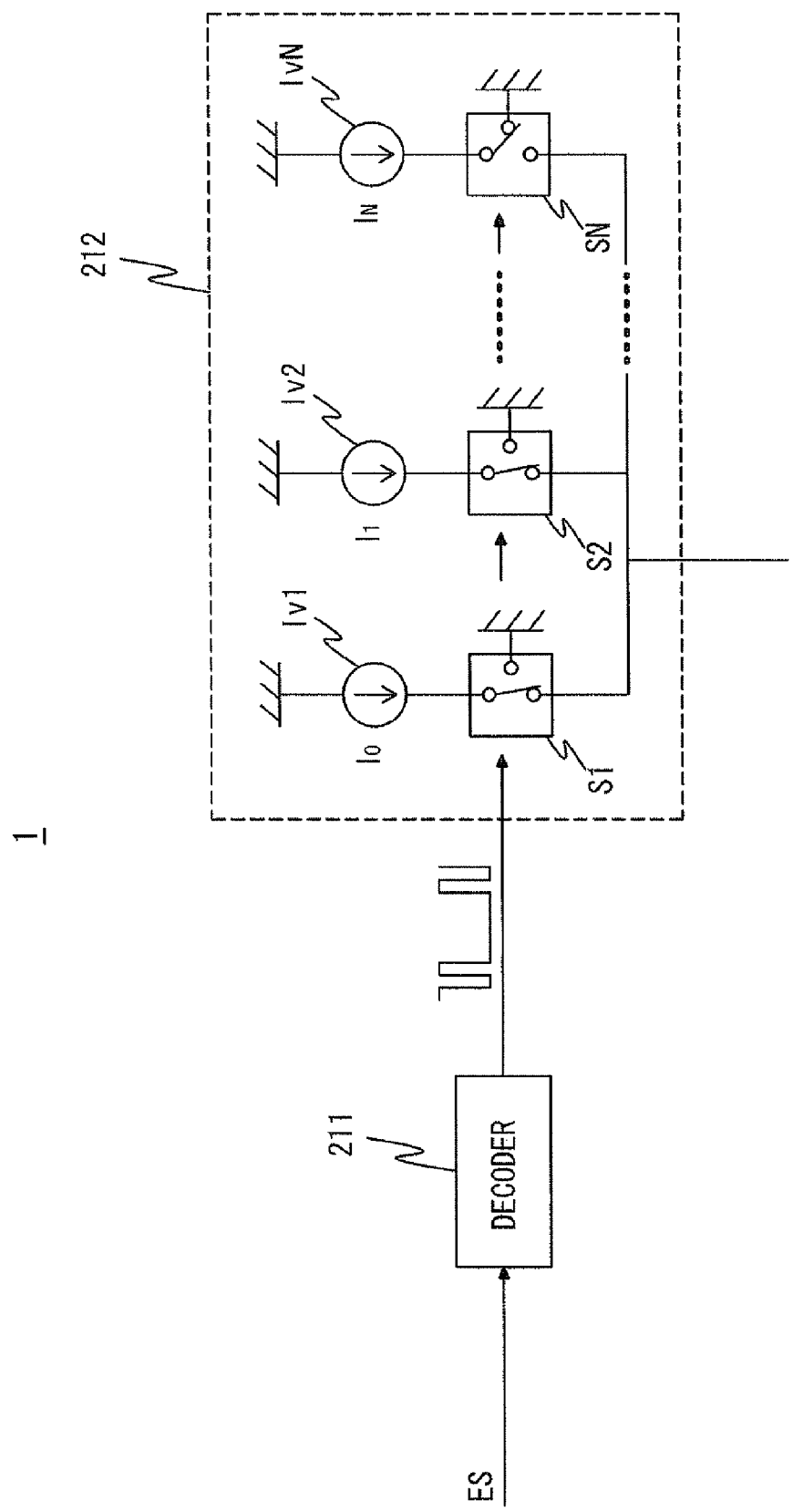
FIG. 7 is a circuit diagram showing another configuration example of the pulse current modulator according to the first exemplary embodiment.

Subsequently, another configuration example of the pulse current modulator 1 will be described. FIG. 7 is a circuit diagram showing another configuration example of the pulse current modulator 1. The pulse current modulator 1 shown in FIG. 7 includes a decoder 211 and a multi-level pulse current modulator 212. The multi-level pulse current modulator 212 includes one or more DC current sources Iv1 to IvN and current switches S1 to SN respectively connected to output terminals of the DC current sources Iv1 to IvN. A current switch Sn (n is an integer equal to or greater than 1) switches an output destination of a current output from the DC current source Ivn to a ground node or an output node of the multi-level pulse current modulator 212. The current output from the multi-level pulse current modulator 212 is equal to the sum of currents output from the DC current source connected to the output node of the multi-level pulse current modulator 212 through the current switch. The current switches S1 to SN may have a configuration shown in FIG. 3, for example. The DC current sources Iv1 to IvN may have a configuration shown in FIG. 6, for example.

The envelope signal ES is input to the decoder 211. When the envelope signal ES is an N-bit digital signal, the multi-level pulse current modulator 212 is provided with the DC current sources Iv1 to IvN. A current value In of the DC current source Ivn is weighted by a power of 2. Specifically, the current value In is represented by $10 \times 2^{-n}$. Here, 10 represents a given value. Specifically, 10 is set to be the maximum value of required envelope signals when all the currents of the DC current sources Iv1 to IvN are output from the multi-level pulse current modulator 212. The decoder 211 sequentially allocates the bits of the N-bit digital signal from the highest bit as control signals for the current switches S1 to SN respectively connected to the DC current sources Iv1 to IvN. When the envelope signal is an analog signal, this analog signal is converted into an N-bit digital signal by AD conversion. The digital signal generated by AD conversion is input to the decoder 211.

The number of values that the current output from the pulse current modulator according to this configuration example may have is larger than the number of values that the current output from the pulse current modulator according to another configuration example including the DC current source 11 shown in FIG. 6 may have (two values of 0 and the current value of the internal DC current source). Thus, the accuracy of reproducing the envelope signals is improved. Then, the amount of current corrected by the linear amplifier 2 becomes smaller. Accordingly, it is possible to reduce the power consumption Pla in the expression (2) and to improve the efficiency in the power supply modulator 100.

While a part or all of the exemplary embodiment stated above may be described as shown in the following Supplementary notes, it is not limited to them.

(Supplementary note 1) A power supply modulator including: a power amplifier for amplifying a radio signal; a linear amplifier to which negative feedback is applied and receiving an envelope signal of the radio signal; and a pulse current modulator connected to a power supply terminal of the power amplifier and an output terminal of the linear amplifier via an inductor, and outputting a pulse current according to a control signal generated from the envelope signal of the radio signal, in which the pulse current modulator includes: a DC current source; a diode having an anode connected to an output terminal of the DC current source and a cathode connected to an output terminal of the pulse current modulator; and a switching element disposed between the output terminal of the DC current source and a ground potential, and controlled by the control signal.

(Supplementary note 2) The power supply modulator according to Supplementary note 1, including a filter circuit disposed between the pulse current modulator, and the power supply terminal of the power amplifier and the output terminal of the linear amplifier.

(Supplementary note 3) The power supply modulator according to Supplementary note 2, in which the filter circuit is formed by combination of an inductor element and a capacitance element.

(Supplementary note 4) The power supply modulator according to any one of Supplementary notes 1 to 3, in which the pulse current modulator includes N (N is an integer equal to or greater than 2) sets of the DC current source, the diode, and the switching element, a current value output from the DC current source in a k (k is an integer ranging from 2 to N)-th set is twice as large as a current value output from the DC current source in a (k−1)-th set, and each of the N sets of switching elements is controlled according to each bit of the control signal which is an N-bit digital signal.

(Supplementary note 5) The power supply modulator according to any one of Supplementary notes 1 to 3, in which the pulse current modulator includes: an AD converter for converting the control signal which is an analog signal into an M (M is an integer equal to or greater than 2)-bit digital signal; and M sets of the DC current source, the diode, and the switching element, a current value output from the DC current source in a j (j is an integer ranging from 2 to M)-th set is twice as large as a current value output from the DC current source in a (j−1)-th set, and each of the M sets of switching elements is controlled according to each bit of the M-bit digital signal.

(Supplementary note 6) The power supply modulator according to any one of Supplementary notes 1 to 5, in which the DC current source includes: a variable voltage source; an inductor connected to the variable voltage source; a current sensor for detecting a current flowing through the inductor; and a comparison controller for controlling an output voltage value of the variable voltage source such that the current flowing through the inductor and being detected by the current sensor has a predetermined value.

(Supplementary note 7) The power supply modulator according to Supplementary note 6, in which the current sensor includes: a resistor supplied with the current flowing through the inductor; and a differential amplifier for amplifying a difference voltage between both ends of the resistor, to output an amplified signal to the comparison controller.

(Supplementary note 8) The power supply modulator according to Supplementary note 6 or 7, in which the variable voltage source includes third and fourth switching elements disposed in series between a first power supply that outputs a power supply voltage and a second power supply that outputs a ground potential, the third and fourth switching elements being controlled by the comparison controller, and the third switching element is opened and closed in a manner complementary to the fourth switching element.

(Supplementary note 9) The power supply modulator according to Supplementary note 8, in which the comparison controller compares the value of the current flowing through the inductor with the predetermined value, the current being detected by the current sensor, and the comparison controller causes the third and fourth switching elements to be opened and closed in a manner complementary to each other based on a result of the comparison.

(Supplementary note 10) The power supply modulator according to any one of Supplementary notes 1 to 9, in which the switching element includes one of a field-effect transistor and a bipolar transistor.

(Supplementary note 11) A method for controlling a power supply modulator including: supplying an envelope signal of a radio signal to a linear amplifier to which negative feedback is applied; and outputting a current from a pulse current modulator to a power supply terminal of a power amplifier for amplifying the radio signal and an output terminal of the linear amplifier, in which the pulse current modulator outputs a current from a DC current source through a diode having an anode connected to an output terminal of the DC current source and a cathode connected to an output terminal of the pulse current modulator, and a switching element disposed between the output terminal of the DC current source and a ground potential is controlled by a control signal generated from the envelope signal of the radio signal.

Note that the present invention is not limited to the above exemplary embodiment, but can be modified as needed without departing from the gist of the present invention.

While the present invention has been described above with reference to exemplary embodiment, the present invention is not limited to the above exemplary embodiment. The configuration and details of the present invention can be modified in various manners which can be understood by those skilled in the art within the scope of the invention.

This application is based upon and claims the benefit of priority from Japanese Patent Application No. 2010-174454, filed on Aug. 3, 2010, the disclosure of which is incorporated herein in its entirety by reference

INDUSTRIAL APPLICABILITY

The present invention can be applied to, for example, communication devices such as a cellular phone and a wireless LAN.

REFERENCE SIGNS LIST

1 PULSE CURRENT MODULATOR
2, 22 LINEAR AMPLIFIER
3, 24 POWER AMPLIFIER
4 FILTER CIRCUIT
11, 51 DC CURRENT SOURCE
12 CURRENT SWITCH
21 VARIABLE VOLTAGE SOURCE
23, 43 CURRENT SENSOR
25, 26, 42 INDUCTOR
31, 32 N-TYPE FET
33 HIGH-SIDE GATE DRIVER (HSD)
34 LOW-SIDE GATE DRIVER (LSD)
41 VARIABLE DC VOLTAGE SOURCE
44 COMPARISON CONTROLLER
52 VOLTAGE COMPARATOR
53 CODER
100, 200 POWER SUPPLY MODULATOR
211 DECODER
212 MULTI-LEVEL PULSE CURRENT MODULATOR
231 AMPLIFIER
232 RESISTOR
A, B TERMINAL
C1, C2 CAPACITOR
Cg GROUND CAPACITOR
CLKO EXTERNAL CLOCK SIGNAL SOURCE
AMP DIFFERENTIAL INPUT TYPE AMPLIFIER
Ds DIODE
ES ENVELOPE SIGNAL
L, L1, L2 INDUCTOR
S1-SN, Sn CURRENT SWITCH
Sv1, Sv2, SW SWITCHING ELEMENT
T1 CONTROL TERMINAL
T2, T3 SIGNAL TERMINAL
WS RADIO SIGNAL

What is claimed is:

1. A power supply modulator comprising:
a power amplifier for amplifying a radio signal;
a linear amplifier to which negative feedback is applied and receiving an envelope signal of the radio signal; and
a pulse current modulator connected to a power supply terminal of the power amplifier via an inductor and connected to an output terminal of the linear amplifier, and outputting a pulse current according to a control signal generated from the envelope signal of the radio signal, wherein
the pulse current modulator comprises:
a DC current source;
a diode having an anode connected to an output terminal of the DC current source and a cathode connected to an output terminal of the pulse current modulator; and
a switching element disposed between the output terminal of the DC current source and a ground potential, and controlled by the control signal, wherein
the pulse current modulator comprises N (N is an integer equal to or greater than 2) sets of the DC current source, the diode, and the switching element,
a current value output from the DC current source in a k (k is an integer ranging from 2 to N)-th set is twice as large as a current value output from the DC current source in a (k−1)-th set, and
each of the N sets of switching elements is controlled according to each bit of the control signal which is an N-bit digital signal.

2. The power supply modulator according to claim 1, comprising a filter circuit disposed between the pulse current modulator, and the power supply terminal of the power amplifier and the output terminal of the linear amplifier.

3. A power supply modulator comprising:
a power amplifier for amplifying a radio signal;
a linear amplifier to which negative feedback is applied and receiving an envelope signal of the radio signal; and
a pulse current modulator connected to a power supply terminal of the power amplifier via an inductor and connected to an output terminal of the linear amplifier, and outputting a pulse current according to a control signal generated from the envelope signal of the radio signal, wherein
the pulse current modulator comprises:
a DC current source;
a diode having an anode connected to an output terminal of the DC current source and a cathode connected to an output terminal of the pulse current modulator; and a switching element disposed between the output terminal of the DC current source and a ground potential, and controlled by the control signal, wherein the pulse current modulator comprises:
- an AD converter for converting the control signal which is an analog signal into an M (M is an integer equal to or greater than 2)-bit digital signal; and
- M sets of the DC current source, the diode, and the switching element, a current value output from the DC current source in a j (j is an integer ranging from 2 to M)-th set is twice as large as a current value output from the DC current source in a (j−1)-th set, and each of the M sets of switching elements is controlled according to each bit of the M-bit digital signal.

4. The power supply modulator according to claim 1, wherein the DC current source comprises:
- a variable voltage source;
- an inductor connected to the variable voltage source;
- a current sensor for detecting a current flowing through the inductor; and
- a comparison controller for controlling an output voltage value of the variable voltage source such that the current flowing through the inductor and being detected by the current sensor has a predetermined value.

5. The power supply modulator according to claim 4, wherein the current sensor comprises:
- a resistor supplied with the current flowing through the inductor; and
- a differential amplifier for amplifying a difference voltage between both ends of the resistor, to output an amplified signal to the comparison controller.

6. The power supply modulator according to claim 4, wherein
- the variable voltage source comprises first and second switching elements disposed in series between a first power supply that outputs a power supply voltage and a second power supply that outputs a ground potential, the first and second switching elements being controlled by the comparison controller, and
- the first switching element is opened and closed in a manner complementary to the second switching element.

7. The power supply modulator according to claim 6, wherein
- the comparison controller compares the value of the current flowing through the inductor with the predetermined value, the current being detected by the current sensor, and
- the comparison controller causes the first and second switching elements to be opened and closed in a manner complementary to each other based on a result of the comparison.

8. The power supply modulator according to claim 1, wherein the switching element comprises one of a field-effect transistor and a bipolar transistor.

9. A method for controlling a power supply modulator comprising:
- supplying an envelope signal of a radio signal to a linear amplifier to which negative feedback is applied; and
- outputting a current from a pulse current modulator to a power supply terminal of a power amplifier for amplifying the radio signal and an output terminal of the linear amplifier, wherein the pulse current modulator outputs a current from a DC current source through a diode having an anode connected to an output terminal of the DC current source and a cathode connected to an output terminal of the pulse current modulator, and a switching element disposed between the output terminal of the DC current source and a ground potential is controlled by a control signal generated from the envelope signal of the radio signal, wherein the pulse current modulator comprises N (N is an integer equal to or greater than 2) sets of the DC current source, the diode, and the switching element, a current value output from the DC current source in a k (k is an integer ranging from 2 to N)-th set is twice as large as a current value output from the DC current source in a (k−1)-th set, and each of the N sets of switching elements is controlled according to each bit of the control signal which is an N-bit digital signal.

10. The power supply modulator according to claim 2, wherein the filter circuit is formed by combination of an inductor element and a capacitance element.

11. A method for controlling a power supply modulator, the method comprising:
- supplying an envelope signal of a radio signal to a linear amplifier to which negative feedback is applied; and
- outputting a current from a pulse current modulator to a power supply terminal of a power amplifier for amplifying the radio signal and an output terminal of the linear amplifier, wherein the pulse current modulator outputs a current from a DC current source through a diode having an anode connected to an output terminal of the DC current source and a cathode connected to an output terminal of the pulse current modulator, and a switching element disposed between the output terminal of the DC current source and a ground potential is controlled by a control signal generated from the envelope signal of the radio signal, wherein the pulse current modulator comprises:
- an AD converter for converting the control signal which is an analog signal into an M (M is an integer equal to or greater than 2)-bit digital signal; and
- M sets of the DC current source, the diode, and the switching element, a current value output from the DC current source in a j (j is an integer ranging from 2 to M)-th set is twice as large as a current value output from the DC current source in a (j−1)-th set, and each of the M sets of switching elements is controlled according to each bit of the M-bit digital signal.

* * * * *